(12) United States Patent
Hoinkis et al.

(10) Patent No.: US 6,864,171 B1
(45) Date of Patent: Mar. 8, 2005

(54) VIA DENSITY RULES

(75) Inventors: Mark D. Hoinkis, Fishkill, NY (US); Matthias P. Hierlemann, Hsinchu (TW); Mohammed Fazil Fayaz, Pleasantville, NY (US); Andy Cowley, Wappingers Falls, NY (US); Erdum Kaltalioglu, Hsinchu (TW)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/682,462

(22) Filed: Oct. 9, 2003

(51) Int. Cl.[7] .......................................... H01L 21/4763
(52) U.S. Cl. ...................... 438/638; 257/774; 257/775; 257/776; 738/639; 738/640; 738/668
(58) Field of Search ................................ 257/774, 775, 257/776; 438/638, 639, 640, 668

(56) References Cited

U.S. PATENT DOCUMENTS

| | | | | |
|---|---|---|---|---|
| 5,357,403 A | * | 10/1994 | Haller et al. | 361/794 |
| 5,904,569 A | * | 5/1999 | Kitch | 438/692 |
| 6,037,547 A | * | 3/2000 | Blish, II | 174/264 |
| 6,395,630 B2 | * | 5/2002 | Ahn et al. | 438/667 |
| 6,413,872 B1 | * | 7/2002 | Kitch | 438/692 |
| 6,501,186 B1 | * | 12/2002 | Yu et al. | 257/786 |

* cited by examiner

*Primary Examiner*—Allan R. Wilson
*Assistant Examiner*—Edgardo Ortiz
(74) *Attorney, Agent, or Firm*—Brinks Hofer Gilson & Lione

(57) ABSTRACT

Thermo-mechanical stress on vias is reduced, thereby reducing related failures. This can be done by maintaining a via-to-metal area ratio at least as large as a predetermined value below which the additional stress on the vias does not significantly increase.

15 Claims, 2 Drawing Sheets

VIA DENSITY RULES

FIELD OF THE INVENTION

The invention relates generally to semiconductor manufacturing and, more particularly, to via density rules for semiconductor applications.

BACKGROUND OF THE INVENTION

As semiconductor wafers progress to higher density chips with shrinking geometries, the materials and processes used in wafer fabrication are changing. At the same time, each chip has literally tens of billions of electrical connections between the various metal layers and silicon devices. Electrical performance is improved though concurrent scaling of device features.

Multiple conductive and insulating layers are required to enable the interconnection and isolation of devices on different layers. The interlayer dielectric ("ILD") serves as an insulator material between each metal layer or between a first metal layer and the wafer. ILDs can be made of a low-k insulating material, such as SiLK. ILDs have many small vias, which are openings in the ILD that provide an electrical pathway from one metal layer to an adjacent metal layer. Metal layers can be made of copper. Vias are filled with a conductive metal, traditionally tungsten and more recently copper.

In interconnect structures, the connecting vias between metal layers are subject to significant thermo-mechanical stresses that can result in, for example, thermal-cycle and via resistance shift failures. Thermo-mechanical stress can occur when the thermal expansion coefficient of copper is less than that of the ILD materials. This is particularly true when the via chain structure includes a via that is relatively isolated, as in plate-below and Difmac 100 via chain structures. A plate-below via chain structure includes copper metal lines that are, for example, greater than or equal to 0.8 $\mu$m in width, at a lower line level that is connected by vias to an upper line level that has copper metal lines that are, for example, less than or equal to 0.8 $\mu$m in width. A Difmac 100 via chain structure includes metal lines with a width, for example, greater than or equal to 0.8 $\mu$m, at both the upper and lower line levels which are connected by vias that have a diameter, for example, less than or equal to 0.2 $\mu$m. Conversely, structures, such as the ground-rule via chain, that have a high via density experience fewer such failures. Additionally, recent modeling work has indicated that via stress increases as via density decreases. Modeled stress in vias has been correlated with thermal cycle failures and it follows that a higher via density favors thermal-cycle reliability.

The use of via fill patterns and line fill patterns has been suggested as a possible modification to decrease thermal cycle failures. However, this solution would have to be modified in order to address large metal pads with isolated vias.

It is therefore desirable to provide a solution that can avoid thermo-mechanical stress on vias and related failures, while also maintaining an economical via density. Exemplary embodiments of the present invention can provide a via-to-metal area ratio at least as large as a predetermined value below which the additional stress on the vias does not significantly increase.

BRIEF DESCRIPTION OF THE DRAWINGS

The above and further advantages of the invention may be better understood by referring to the following description in conjunction with the accompanying drawings in which corresponding numerals in the different figures refer to the corresponding parts, in which.

DETAILED DESCRIPTION

While the making and using of various embodiments of the present invention are discussed herein in terms of specific geometries, it should be appreciated that the present invention provides many inventive concepts that can be embodied in a wide variety of contexts. The specific embodiments discussed herein are merely illustrative of specific ways to make and use the invention, and are not meant to limit the scope of the invention.

The present invention can reduce the thermo-mechanical stress on vias and thereby reduce related failures. Exemplary embodiments of the present invention can provide a via-to-metal area ratio at least as large as a predetermined value below which the additional stress on the vias does not significantly increase.

Figure 1:
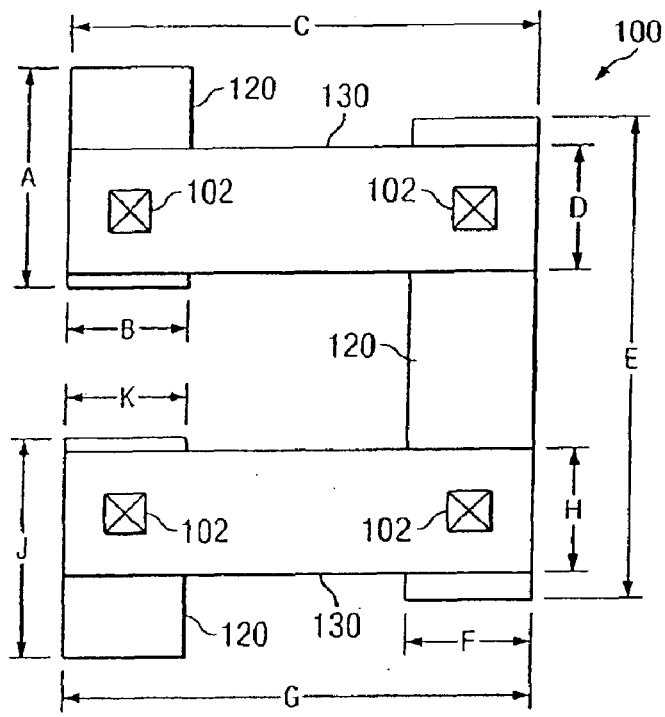
FIG. 1 diagrammatically illustrates a top down view of a semiconductor interconnect architecture with isolated vias in accordance with the known art.

FIG. 1 diagrammatically illustrates a top down view of a semiconductor interconnect architecture ("SIA") 100 with isolated vias 102 in accordance with the known art. In FIG. 1, lower metal layer (M1) 120 and upper metal layer (M2) 130 are interconnected by isolated vias 102. Conventionally, semiconductor interconnect architectures such as SIA 100 can be implemented as structures such as plate-below and Difmac 100.

Figure 2:
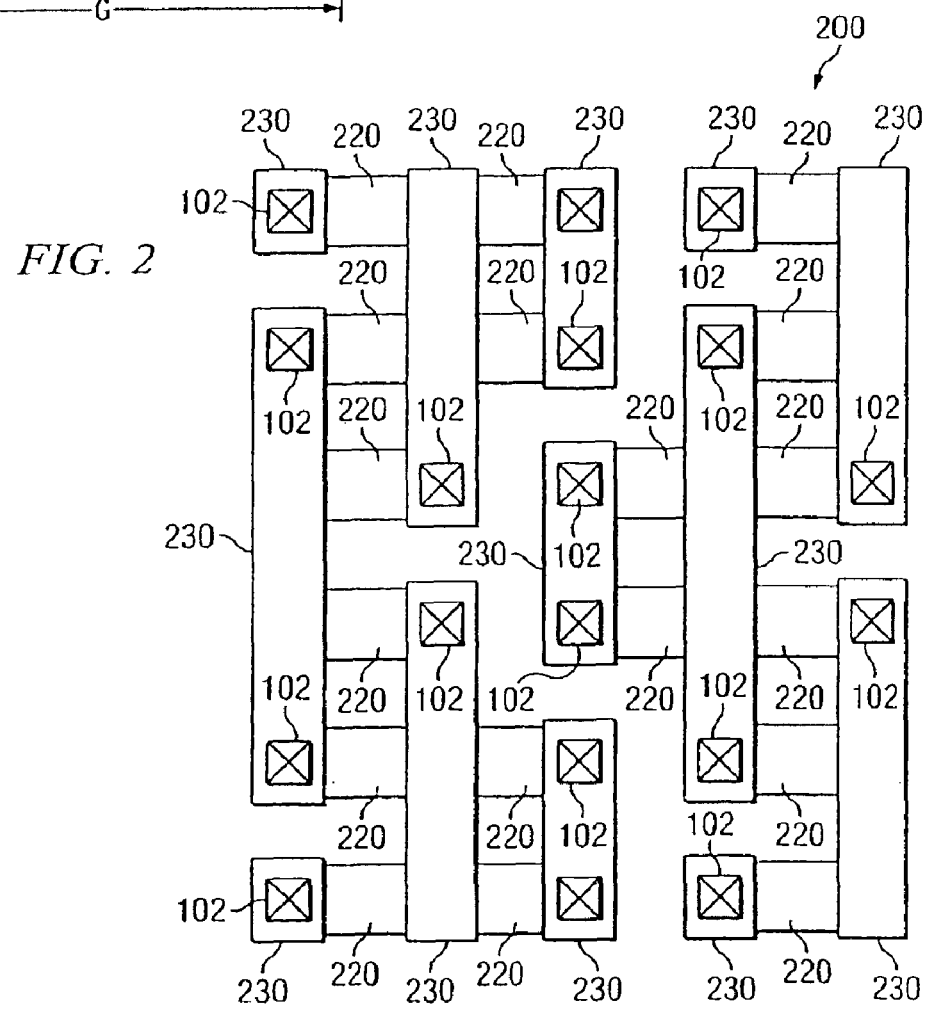
FIG. 2 diagrammatically illustrates a top down view of exemplary embodiments of a semiconductor interconnect architecture with a via density in accordance with the present invention.

FIG. 2 diagrammatically illustrates a top down view of exemplary embodiments of a semiconductor interconnect architecture ("SIA") 200 with a via density in accordance with the present invention. In FIG. 2, lower metal layer (M1) 220 and upper metal layer (M2) 230 are interconnected by vias 102. The semiconductor interconnect architecture SIA 200 can be implemented as a structure such as a ground-rule via chain.

Figure 3:
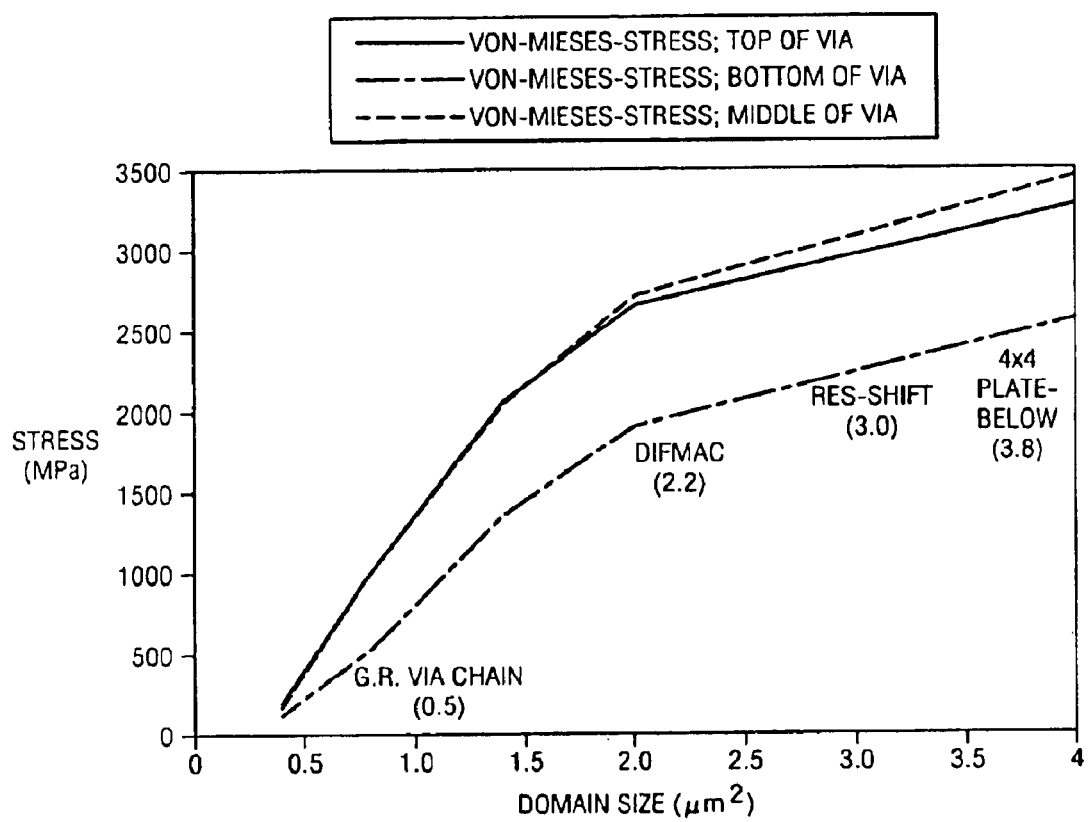
FIG. 3 graphically illustrates via stresses in several conventionally known via chain structures.

The exemplary stress-modeling results graphically illustrated in FIG. 3, are provided for an exemplary via having approximately a 0.04 $\mu$m$^2$ cross-sectional area. As shown by FIG. 3, when there is less than one (1) via per 4 $\mu$m$^2$, or 0.25 via/$\mu$m$^2$, a stress plateau is reached such that if the via density decreases further, the mechanical stress on the vias does not significantly increase relative to the mechanical stress on the vias when there is more than one (1) via per 4 $\mu$m$^2$. Conventionally known semiconductor interconnect architectures (or via chain structures) with low via densities are prone to thermal-cycle failure. Conventionally known via chain structures with higher via densities have relatively few via-resistance shift/thermal cycle problems. Therefore, it follows that an increase in vias per unit area will result in a decrease in stress.

For any two (2) metal layers connected by vias, the via density is the ratio of the total number of connecting vias to the area occupied by the connected metal layers. The concept of via density can be illustrated with reference to FIG. 1, wherein the number of vias is four (4). The total area occupied by the two (2) metal layers connected by the four (4) vias in FIG. 1 is: AREA=((A×B)+((C−B)×D)+((E−D)×F)+((G−F)×H)+((J−H)×K)). Therefore, in this illustrative example, the via density is 4/AREA.

The stress-modeling results graphically illustrated in the example of FIG. 3 indicate that, for the aforementioned example of 0.04 $\mu m^2$ vias, if the via density can be maintained above a critical value of approximately 0.25 via/$\mu m^2$, this can decrease thermal cycle and via resistance shift failures. Specific structural characteristics, such as the linewidth above or below a via, may influence the stress in the via, suggesting that the critical via density needed to reduce thermal cycle and via resistance shift failures may be somewhat geometry dependent. For example, older technologies have larger design rules (e.g., larger via diameters and distances), while newer technologies have tighter design rules (e.g., smaller via diameters and distances). Conventionally known redundant vias or dummy vias can be used to increase via densities.

Additionally, the critical via density can scale with via size. A critical via density of 0.25 via/$\mu m^2$ with the aforementioned 0.04 $\mu m^2$ vias results in a 0.04:4 (or 1/100) via-to-metal area ratio, meaning the ratio of total via area to total area occupied by the two (2) metal layers connected by the vias. If, for example, the circuit dimensions are reduced by a factor of 0.7 in both the x and y directions, then the corresponding via dimensions would also be reduced by a factor of 0.7. Therefore, for any two (2) metal layers connected by vias, the aforementioned area ratio would remain constant at 1/100, even with the dimensional reductions. In this example of reducing the circuit dimensions, the via density would increase, because the number of vias remains constant while the metal area decreases. As further examples, a 1/100 area ratio requires via densities of approximately 0.3 via/$\mu m^2$ and 0.44 via/$\mu m^2$ using vias of approximately 0.03 $\mu m^2$ and 0.02 $\mu m^2$ cross-sectional areas, respectively.

Designing semiconductor interconnect architectures with area ratios above approximately 1/100 can result in reduced via-resistance shift/thermal cycle problems. The closer the area ratio gets to the ratio used in ground-rule via chains (i.e., 1:4), the greater the reduction in via-resistance shift/thermal cycle problems. Workers in the art will recognize the additional applicability of this invention to semiconductor devices including technology generations of 0.25 $\mu m$ and below that use ILD material with thermal expansion coefficients higher than copper, such as silicon low-k ("SiLK") dielectric material.

Although examplary embodiments of the present invention have been described in detail, it will be understood by workers in the art that various modifications can be made therein without departing from the spirit and scope of the invention as set forth in the appended claims.

What is claimed is:

1. A method of designing a semiconductor interconnect architecture including a pair of metal layers interconnected by a plurality of conductive vias, the method comprising:
   determining via stress as a function of a via density, the via density being a ratio of the plurality of conductive vias interconnecting the pair of metal layers to an area of the pair of metal layers;
   identifying a via to metal ratio value below which the stress on a via does not significantly increase relative to the stress on the via above the via to metal ratio value; and
   positioning the plurality of conductive vias in the semiconductor interconnect architecture according to via to metal ratio being at least as large as said via to metal ratio value.

2. The method of claim 1, wherein said value is approximately 1/100.

3. The method of claim 2, wherein each of said plurality of conductive vias has a cross-sectional area of approximately 0.04 $\mu m^2$ and said semiconductor interconnect architecture has a via density of approximately 0.25 via/$\mu m^2$.

4. The method of claim 2, wherein each of said plurality of conductive vias has a cross-sectional area of approximately 0.03 $\mu m^2$ and said semiconductor interconnect architecture has a via density of approximately 0.3 via/$\mu m^2$.

5. The method of claim 2, wherein each of said plurality of conductive vias has a cross-sectional area of approximately 0.02 $\mu m^2$ and said semiconductor interconnect architecture has a via density of approximately 0.44 via/$\mu m^2$.

6. A method of producing a semiconductor interconnect architecture, the method comprising:
   providing a first metal layer;
   providing a second metal layer; and
   providing a plurality of conductive vias interconnecting said first and second metal layers;
   determining via stress as a function of a via density, the via density being a ratio of the plurality of conductive vias interconnecting the first metal layer and the second metal layer to an area occupied by the first metal layer and the second metal layer; and
   positioning the plurality of conductive vias in the semiconductor interconnect architecture according to a via-to-metal area ratio being at least as large as a predetermined via-to-metal area ratio value below which the stress on the vias does not significantly increase relative to the stress on the vias above the value.

7. The method of claim 6, wherein said value is approximately 1/100.

8. The method of claim 7, wherein each of said plurality of conductive vial has a cross-sectional area of approximately 0.04 $\mu m^2$ and said semiconductor interconnect architecture has a via density of approximately 0.25 via/$\mu m^2$.

9. The method of claim 7, wherein each of said plurality of conductive vias has a cross-sectional area of approximately 0.03 $\mu m^2$ and said semiconductor interconnect architecture has a via density of approximately 0.3 via/$\mu m^2$.

10. The method of claim 7, wherein each of said plurality of conductive vias has a cross-sectional area of approximately 0.02 $\mu m^2$ and said semiconductor interconnect architecture has a via density of approximately 0.44 via/$\mu m^2$.

11. A semiconductor interconnect architecture, the architecture comprising:
   a first metal layer;
   a second metal layer; and
   a plurality of conductive vias interconnecting said first and second metal layers, said vias arranged with respect to the first metal layer and the second metal layer according to a via-to-metal area ratio being at least as large as a predetermined via-to-metal area ratio value below which stress on the plurality of vias does not significantly increase relative to stress on the vias above the value.

12. The semiconductor interconnect architecture of claim 11, wherein said value is approximately 1/100.

13. The semiconductor interconnect architecture of claim 12, wherein each of said plurality of conductive vias has a cross-sectional area of approximately 0.04 $\mu m^2$ and said semiconductor interconnect architecture has a via density of approximately 0.25 via/$\mu m^2$.

14. The semiconductor interconnect architecture of claim 12, wherein each of said plurality of conductive vias has a cross-sectional area of approximately 0.03 $\mu m^2$ and said semiconductor interconnect architecture has a via density of approximately 0.3 via/$\mu m^2$.

15. The semiconductor interconnect architecture of claim 12, wherein each of said plurality of conductive vias has a cross-sectional area of approximately 0.02 $\mu m^2$ and said semiconductor interconnect architecture has a via density of approximately 0.44 via/$\mu m^2$.

* * * * *

UNITED STATES PATENT AND TRADEMARK OFFICE
CERTIFICATE OF CORRECTION

PATENT NO. : 6,864,171 B1
DATED : March 8, 2005
INVENTOR(S) : Mark D. Hoinkis et al.

It is certified that error appears in the above-identified patent and that said Letters Patent is hereby corrected as shown below:

Title page,
Item [75], Inventors, delete "Erdum" and substitute -- Erdem -- in its place.

Signed and Sealed this

Twelfth Day of July, 2005

JON W. DUDAS
*Director of the United States Patent and Trademark Office*